(12) United States Patent
Beele et al.

(10) Patent No.: US 6,346,301 B2
(45) Date of Patent: Feb. 12, 2002

(54) COATING METHOD FOR PRODUCING A HEAT-INSULATING LAYER ON A SUBSTRATE

(75) Inventors: Wolfram Beele, Ratingen; Thomas Jung, Hoetzum; Peter-Jochen Brand, Braunschweig, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/813,259

(22) Filed: Mar. 20, 2001

Related U.S. Application Data

(62) Division of application No. 09/274,507, filed on Mar. 23, 1999, which is a continuation of application No. PCT/DE97/02152, filed on Sep. 23, 1997.

(30) Foreign Application Priority Data

Sep. 23, 1996 (DE) .......................................... 196 38 979

(51) Int. Cl.$^7$ ................................................. B05D 3/00
(52) U.S. Cl. ........................ 427/561; 427/573; 427/576; 427/255.31; 427/255.32; 427/255.36; 427/295; 427/422
(58) Field of Search ................................. 427/561, 573, 427/576, 255.31, 255.32, 255.36, 295, 422

(56) References Cited

U.S. PATENT DOCUMENTS

| | | |
|---|---|---|
| 4,321,310 A | 3/1982 | Ulion et al. |
| 4,321,311 A | 3/1982 | Strangman |
| 4,405,659 A | 9/1983 | Strangman |
| 5,087,477 A | 2/1992 | Giggins, Jr. et al. |
| 5,238,752 A | 8/1993 | Duderstadt et al. |
| 5,262,245 A | 11/1993 | Ulion et al. |
| 5,514,482 A | 5/1996 | Strangman |

FOREIGN PATENT DOCUMENTS

| | | |
|---|---|---|
| DE | 294 511 A5 | 10/1991 |
| DE | 42 35 953 A1 | 4/1994 |
| DE | 44 22 472 A1 | 1/1996 |
| WO | WO 93/18199 | 9/1993 |

OTHER PUBLICATIONS

J.T. Prater et al.: "Ceramic Thermal Barrier Coatings With Improved Corrosion Resistance" in Surface and Coatings Technology, 32 1987, Elsevier Sequoia, Netherlands, pp. 389–397, (no month avail.).
E. S. Thiele et al.: "Deposition and properties yttria–stabilized zirconia thin films using reactive direct current magnetron sputtering" in J. Vac. Sci. Technol. A 9 (6), Nov./Dec. 1991, pp. 3054–3060.
T. Jung et al.: "Zirconia thin film deposition on silicon by reactive gas flow sputtering: the influence of low energy particle bombardment", in materials Science and Engineering, A 140 (1991), Elservier Sequoia, Netherlands, pp. 528–533, (no month avail.).
T. Jung et al.: "High rate deposition of alumina films by reactive gas flow sputtering", in Surface and Coatings Technology, 1993, Elsevier Sequoia, Netherlands, pp. 171–176, (no month avail.).
Y.H. Sohn et al.: "Microstructural development in physical vapour–deposited partially stabilized zirconia thermal barrier coatings", (PCT 206) 2191 Thin Solid Films 250 (1994) Oct. 1, No. 1/2, Lausanne, CH, pp. 1–7.

*Primary Examiner*—Bernard Pianalto
(74) *Attorney, Agent, or Firm*—Herbert L. Lerner; Laurence A. Greenberg; Werner H. Stemer

(57) ABSTRACT

The invention relates to a component having a substrate and a ceramic heat-insulating layer which is arranged thereon. This heat-insulating layer has a columnar structure having ceramic stems which are essentially oriented mainly normal to the surface of the substrate and have a respective stem diameter of less than 2.5 μm. The invention also relates to a coating apparatus for producing a heat-insulating layer on a substrate and to a method of coating a substrate in the manner of a reactive gas-flow sputtering method.

4 Claims, 1 Drawing Sheet

COATING METHOD FOR PRODUCING A HEAT-INSULATING LAYER ON A SUBSTRATE

CROSS REFERENCE TO RELATED APPLICATION

This application is a division of U.S. application Ser. No. 09/274,507 filed Mar. 23, 1999 which was a continuation of International Application PCT/DE97/02152, filed Sep. 23, 1997, which designated the United States.

BACKGROUND OF THE INVENTION

Field of the Invention

The invention relates to a coating apparatus for producing a heat-insulating layer, in particular a heat-insulating-layer system, on a base and to a method of coating a base under vacuum with a heat-insulating layer.

U.S. Pat. No. 5,238,752 discloses a heat-insulating-layer system having an intermediate bond coating. The heat-insulating-layer system is applied to a metallic substrate, in particular a Cr—Co steel for an aircraft powerplant blade. Cobalt- or nickel-based alloys are specified as further materials for the substrate. Applied directly to this metallic substrate is an intermediate layer, in particular consisting of a nickel aluminide or a platinum aluminide.

Adjoining this intermediate coating is a thin ceramic layer of aluminum oxide, to which the actual heat-insulating layer, in particular consisting of zirconium oxide stabilized with yttrium oxide, is applied. This ceramic heat-insulating layer of zirconium oxide has a rod-shaped structure, the rod-shaped stems being oriented essentially perpendicularly to the surface of the substrate. This is intended to ensure an improvement in the cyclic thermal loading capacity. The heat-insulating layer is deposited on the substrate by means of an electron-beam PVD (physical vapor deposition) method, in the course of which zirconium oxide and yttrium oxide are evaporated from a metal-oxide body by means of an electron-beam gun. The method is carried out in an apparatus in which the substrate is preheated to a temperature of about 950° C. to 1000° C. The substrate is rotated in the stream of metal oxide during the coating operation. Details of the rod-shaped grain structure and its properties cannot be gathered from U.S. Pat. No. 5,238,752. The electron-beam PVD method of producing ceramic coatings having a rod-shaped grain structure is also described. In U.S. Pat. No. 5,087,477 and U.S. Pat. No. 5,262,245, the deposition of zirconium oxide on a substrate being effected in an oxygen atmosphere.

Further methods and examples of applying a heat-insulating-layer system to a gas-turbine blade are described in U.S. Pat. No. 5,514,482 and U.S. Pat. No. 4,405,659.

According to U.S. Pat. No. 4,405,659, it is supposed to be possible with the electron-beam PVD method to apply a heat-insulating layer of zirconium oxide which is stabilized with yttrium oxide and has a thickness of about 125 $\mu$m and a columnar structure. The average cross-sectional area of a stem is said to be in the order of magnitude of 6.5 $\mu m^2$.

U.S. Pat. No. 4,321,310 and U.S. Pat. No. 4,321,311 each describe heat-insulating-layer systems which have an adherent layer between the zirconium oxide and the metallic substrate with an alloy of the MCrAlY type. Here, "M" stands for one of the metals cobalt, nickel or iron, "Cr" stands for chromium, "Al" stands for aluminum and "Y" stands for yttrium. A PVD (physical vapor deposition) method is disclosed as a possible method for producing a heat-insulating layer of zirconium oxide.

The coating of metallic components, in particular gas-turbine blades consisting of a superalloy, from a composite system having an adhesive layer and a heat-insulating layer is likewise described in International patent Application WO 93/18199 A1. Here, the heat-insulating layer is preferably applied by the electron-beam PVD method, although other PVD methods, such as sputtering and arc deposition, could also be suitable for this purpose.

In the article "Zirconia thin film deposition on silicon by reactive gas flow sputtering: the influence of low energy particle bombardment" by T. Jung and A.Westphal, in Material Science and Engineering, A 140, 191, pages 528 to 533, the so-called reactive gas-flow sputtering method is disclosed for producing zirconium-oxide layers on semiconductor substrates, in particular on a silicon basis. Here, the method relates to the cold deposition of zirconium oxide, which leads to an amorphous growth of the zirconium oxide. This amorphous deposition is effected at substrate temperatures of markedly less than 800° C., heating of the substrate being effected directly, with losses by the substrate carrier. For this purpose, the substrate carrier itself can be heated up to at most a temperature of about 800° C., so that, with due allowance for the heat losses which occur, heating of the substrate to over 400° C. can be achieved.

In German Democratic Republic Patent No. DD 294 511 A5, corresponding to this article, an inert gas, in particular argon, is passed through a hollow cathode, in the interior of which an anode is arranged, so that ionization of argon atoms takes place. The latter strike the cathode, as a result of which cathode material passes into the interior of the hollow cathode and is passed out of the latter with the inert-gas flow. The cathode material is a pure metal, to which oxygen is fed outside the hollow cathode, so that complete oxidation of the metal, in particular zirconium, takes place. Here, the partial pressure of the fed oxygen is in the order of magnitude of $10^{-4}$ Pa. The total dynamic pressure in the vicinity of the semiconductor to be coated is about 13 Pa to 24 Pa. The deposition rate is about 15 nm/min, the substrate having a temperature of about 400° C. The hollow cathode is designed as a cylindrical tube of zirconium having a percentage purity of 99.7%.

An alternative design of the hollow cathode for achieving a larger coating area and a higher coating rate is described in the article "High rated deposition of alumina films by reactive gas flow sputtering" by T. Jung and A. Westphal, in Surface and Coatings Technology, 59,1993, pages 171 to 176 (corresponding to German patent Application DE 42 35 953 A1). The hollow cathode disclosed is of linear construction in the sense that plates of zirconium are arranged next to one another in a housing. An inert-gas flow can be passed between each two adjacent plates, so that a plasma of inert-gas atoms forms between adjacent plates. In addition, the plates may have a cooling feature, in particular cooling passages. Test bodies of silicon, stainless steel and glass were coated by the hollow cathode and the strength of the aluminum-oxide layer was tested up to around 200° C. Nothing is said in the two articles mentioned, concerning the structural properties of the oxide layers with regard to crystallite size and orientation.

SUMMARY OF THE INVENTION

It is accordingly an object of the invention to provide a coating apparatus for producing a heat-insulating layer, in particular a heat-insulating-layer system, on a base and to a method of coating a base under vacuum with a heat-insulating layer, that overcome the above-mentioned disadvantages of the prior art components, apparatus, and methods.

With the foregoing and other objects in view there is provided a heat resistant component comprising a substrate and a ceramic heat-insulating layer which is arranged thereon and has a structure having ceramic stems which are oriented mainly normal to the surface of the substrate and have an average stem diameter not exceeding 2.5 $\mu$m and preferably 0.5 to 2.0 $\mu$m.

There is also provided a coating apparatus for producing a heat-insulating layer on a substrate, comprising a) a holding device for positioning the substrate, b) a hollow-cathode arrangement through which an inert gas can flow and which comprises a cathode material and an anode and has a gas-outlet opening facing the holding device, and a gas-inlet opening for inert gas, and c) a separate heating device for directly heating the substrate with heat radiation and/or convection.

There is moreover provided a method of coating a substrate under vacuum with a heat-insulating layer, in which method an inert gas is ionized in an essentially oxygen-free atmosphere, and the ionized inert gas releases from a metallic cathode material metal atoms, which are carried along with the inert gas in the direction of the substrate and to which oxygen is fed before the substrate is reached, so that a metal oxide forms and is deposited on the substrate, or metal is deposited on the substrate and is oxidized by oxygen coming into contact with it, the substrate being heated to a predetermined germinating temperature of over 800° C.

Thermal protection of the substrate, particularly a metallic substrate, is ensured by a ceramic heat-insulating layer. However, known ceramic structures are susceptible to cyclic thermal stresses and can tend to break apart and/or lose their adhesive properties. The resistance to alternating thermal stresses is markedly increased by a microstructure having ceramic stems of smaller diameter than the diameter achievable hitherto. A microstructure having ceramic stems of an average stem diameter of less than 2.5 $\mu$m, in particular between 0.5 $\mu$m and 2.0 $\mu$m, has a high expansion tolerance and a high cyclic loading capacity on account of its orientation essentially perpendicularly to the surface of the substrate and of the columnar fine structure. This readily compensates for differences in the coefficients of thermal expansion of the substrate, particularly a metallic substrate, and the ceramic heat-insulating layer. Such small stem diameters can be achieved by a reactive gas-flow sputtering method developed for high temperatures.

For good bonding of the ceramic heat-insulating layer to the metallic substrate, in particular consisting of a nickel-based alloy or other alloys suitable for producing components which can be subjected to high thermal stress, a metallic adhesive layer is applied to the substrate. With regard to the layer thickness of a few micrometers, reference may be made to U.S. Pat. No. 5,238,752, U.S. Pat. No. 4,321,310 and U.S. Pat. No. 4,321,311. In accordance with an additional feature of the invention, the metallic adhesive layer preferably consists of an alloy of the McrAlY type, where M stands for one or more of the elements iron, cobalt or nickel, Cr stands for chromium, Al stands for aluminum and Y stands for yttrium or one of the elements of the rare earths. An intermetallic compound, e.g. consisting of nickel aluminide or platinum aluminide, is likewise suitable as the adhesive layer.

In accordance with another feature of this invention, it is also advantageous, in particular with regard to prolongation of the service life and adhesion of the heat-insulating layer to the substrate, to produce a chemical bond between the heat-insulating layer and the metallic adhesive layer. This is achieved, for example, by a thin layer of an inorganic aluminum compound such as aluminum oxide ($Al_2O_3$). A layer of a ternary Al—Zr—O compound or an Al—O—N compound is likewise suitable as mediator layer. The ternary Al—Zr—O compound, e.g. $Al_2Zr_2O_7$, is preferably suitable for the bonding of a heat-insulating layer which contains zirconium oxide. In the case of other ceramic heat-insulating layers, for example consisting of magnesium oxide, other spinels may accordingly be used. A layer of aluminum nitride or a compound (mixed layer) of aluminum nitride and aluminum oxide is also suitable.

In a further feature according to this invention, the heat-insulating layer preferably includes a metal-ceramic substance, in particular zirconium oxide ($ZrO_2$). This metal oxide is preferably produced with a stabilizer, such as yttrium oxide ($Y_2O_3$), in order to avoid a phase transformation at high temperatures. A content of 3% by weight to 12% by weight, in particular 7% by weight, of yttrium oxide is preferably added to the zirconium oxide.

A ceramic heat-insulating layer having a fine columnar structure with an average stem diameter of less than 2.5 $\mu$m is especially suitable for thermal protection of components of a gas turbine which are subjected to cyclic thermal stress of more than 1000° C. These include in particular gas-turbine blades as well as components of a heat shield of a combustion chamber of a gas turbine. This applies both to stationary gas turbines for use in power stations and to aircraft powerplant turbines. Of course, the heat-insulating layer according to the invention is also suitable for other components subjected to high thermal stress.

The coating apparatus for producing a heat-insulating layer on a substrate according to this invention has a holding device for positioning the parent body, a hollow cathode through which an inert gas can flow and which comprises a cathode material and an anode and has a gas-outlet opening, facing the holding device, and a gas-inlet opening for inert gas, and an additional, separate heating device for heating the substrate.

In the hollow-cathode arrangement, which is of hollow-cylindrical design with a circular or a rectangular cross-section, a glow discharge is produced by applying a direct-current voltage between cathode and anode.

The anode may be designed, for example, in a rod shape and may be arranged within the cathode or outside the cathode, in particular so as to enclose the cathode as a housing. Due to a plasma which develops in the cathode, such a large voltage drop is present in each case between the plasma and the cathode that constant ionization is maintained. Inert gas entering the gas-inlet opening is thereby ionized inside the hollow cathode. The ionized inert-gas atoms strike the cathodically connected metal surfaces of the hollow cathodes—this being an ion bombardment so to speak—and lead to an at least partial atomization of the metal surfaces. The cathode material preferably consists of an alloy of zirconium, as a result of which zirconium atoms or zirconium-atom clusters are driven out of the cathode material by the ion bombardment. In accordance with the feature of desired stabilization of the subsequent oxidized zirconium deposited on the substrate according to this invention, a stabilizing metal, such as yttrium, is admixed or alloyed with the cathode material. Accordingly, the cathode material has a predetermined area ratio or volumetric ratio of metallic zirconium and yttrium.

For the oxidation of the zirconium and, if need be, the admixed yttrium in accordance with this invention, an oxidizing-medium feed is provided in the apparatus outside the hollow cathode, through which oxidizing-medium feed oxygen in particular can be fed in appropriate quantities. The atomized zirconium particles and yttrium particles, which are present as metal atoms and/or metal clusters, are transported out of the hollow-cathode arrangement with the gas flow of the inert gas, in particular argon. These particles are completely oxidized outside the hollow cathode in a controlled oxygen reaction atmosphere. This is done by feeding oxygen through the oxidizing-medium feed in such a way that, in combination with the inert-gas flow, ingress of oxygen into the hollow cathode is prevented, so that oxidation of the cathode material is largely avoided. The oxidized metal particles are deposited on the substrate as a metal-oxide-ceramic heat-insulating layer. The oxidation may also take place immediately after the deposition on the surface of the substrate. To achieve the desired columnar structure, the pressure inside the coating apparatus as well as the temperature, in particular the temperature of the substrate, are controlled appropriately. The substrate is heated via a heating device to a temperature of over 900° C., in particular to 950° C. and up to about 1050° C.

With the coating apparatus according to this invention for carrying out a high-temperature gas-flow sputtering method, decoupling of the working atmosphere for the ionization of the inert gas (plasma source) from the component to be coated is achieved. Compared with conventional PVD methods, in particular the electron-beam PVD method, there are different value ranges for the characteristic variables, such as pressure of the residual gas (reduced pressure, requisite pumping level of the vacuum system), working pressure and ratio of the reactive gas (oxygen) to the remaining working gases. The atmosphere at the component to be coated can be at a residual-gas pressure of $10^{-3}$ mbar for carrying out the method, in which case the upper limit of the residual pressure can be in the order of magnitude of $10^{-2}$ mbar. The working pressure at the component (main chamber of the coating apparatus) can be in the order of magnitude of between 0.2 and 0.9 mbar. The ratio of the reactive gas (oxygen) to the ionized inert gas (plasma gas), e.g. argon, can be in the range of 0.01 to 0.04.

The atmosphere of the plasma source is essentially isolated from the atmosphere of the component and has a residual-gas pressure in the order of magnitude of the residual-gas pressure at the component. The working pressure of the gas flow can be about 0.02 mbar higher than the working pressure at the component. The working pressure at the component, i.e. in the main chamber of the coating system, is therefore determined by the gas outflow of the source. In the hollow cathode, therefore, there is a positive pressure relative to the main chamber. The ratio of residual-gas constituents, in particular oxygen, to the ionized inert gas (plasma gas) is preferably less than 1%. In this way, the ionization source (the hollow-cathode arrangement) can be run by direct-current operation, since no oxidation of the coating source (hollow cathode) is effected with an unsteady operating state. The occurrence of a glow discharge as well as the production of arc plasma on account of oxidation of the cathode material are thereby avoided.

Compared with known apparatus for carrying out PVD methods, in particular the electron-beam PVD method, a markedly higher residual-gas pressure is thus possible, which leads to a simplified and more cost-effective vacuum system. The residual-gas pressure in the known systems for achieving a columnar heat-insulating layer is in the range of $10^{-6}$ to $10^{-5}$ mbar. In the conventional methods, the working pressure is within the range of $10^{-3}$ to $10^{-2}$ mbar with a technically useful upper limit of less than 0.1 mbar and is thus markedly below the working pressure possible in the reactive gas-flow sputtering method. In addition, a high ratio of reactive gas (oxygen) to other working gases, such as argon, helium, etc., of 10:1 or higher is necessary in the known PVD methods. In the apparatus according to the invention and the method according to the invention, a substantially lower ratio is required, so that the devices for feeding working gas and reactive gas can also be of markedly simpler and less expensive design. In addition, in the known PVD methods, the coating source is not isolated in the main chamber and therefore also lies exposed to oxidation. The apparatus according to the invention can therefore be designed without high-frequency generators or real-time-controlled direct-current generators.

Here, the heating device is preferably designed in such a way that there is uniform heating, in particular volumetric heating, of the substrate. Even at points of the substrate having high mass concentration and large partial volume, a uniform germinating temperature for the substrate as a whole is achieved.

The vacuum (working pressure) inside the coating apparatus is preferably less than 1 mbar and in particular is within the range of between 0.3 mbar and 0.9 mbar, such as, for example, around 0.5 mbar. To establish the desired vacuum, a vacuum pumping device is provided, and this can have a simple construction, e.g. a Roots pump design. Compared with the conventional electron-beam PVD method, in which a rotary-vane backing pump as well as a diffusion pump are to be provided in order to achieve a high vacuum, the vacuum pumping device of the gas-flow sputtering method can be of substantially simpler design.

To achieve as uniform a coating of the component, in particular a gas-turbine blade, as possible, the holding device is adapted for motion of the substrate relative to the gas-outlet opening. The holding device preferably contains a turning mechanism, by means of which continuous rotation of the component about its longitudinal axis is effected.

The object directed towards a method of coating a substrate under vacuum with a heat-insulating layer is achieved by an inert gas being ionized in an essentially oxygen-free atmosphere. This is effected, for example, by the inert gas being passed through a hollow cathode and ionized in the latter. The ionized atoms of the inert gas release from a metallic cathode material metal atoms and/or metal clusters, which are passed out of the hollow cathode with the inert gas and are oxidized with oxygen outside the hollow cathode to form a metal oxide. It is likewise possible for metal to be deposited on the substrate and oxidized there by oxygen coming into contact with it. The metal oxide is deposited on the substrate, which is heated by a separate heating device to a predetermined germinating and condensation temperature. A heat-insulating layer consisting of a metal oxide is thereby produced on the substrate, which heat-insulating layer has a fine columnar microstructure, in which case the average stem diameter can be less than about 2.5 $\mu$m and in particular can be within a range of between 0.5 $\mu$m and 2.0 $\mu$m. This heat-insulating layer has especially good resistance to thermomechanical alternating stresses, as is especially advantageous in particular in the case of parts of a gas-turbine plant, such as turbine blades and insulating components, exposed to hot gas.

In contrast to known electron-beam PVD methods, a pure metal or an alloy consisting of a principal metal and at least one stabilizing metal is used as the cathode material according to this invention. An alloy of zirconium with yttrium is particularly suitable for this, the yttrium being added to the zirconium in such a quantity and distribution that a heat-insulating layer of zirconium oxide partly stabilized with yttrium oxide is obtained.

Other metals which lead to a thermally highly resistant metal oxide, such as magnesium for example, are of course also suitable as cathode material.

The use of a metallic cathode according to this invention instead of a body of metal oxide, as is used, for example, in the known electron-beam PVD methods, has the advantage that the heat-insulating layer produced has a substantially finer structure. Furthermore, the appearance of layer defects, which may occur in the electron-beam PVD method due to defects in the ceramic body, such as inhomogeneous porosity or the effects of impurities, is avoided by a fully reactive oxidation process of the metallic atomization materials released from the cathode material. In addition, the cathode material can be produced in a simpler manner compared with a ceramic body and with extremely high purity.

The bonding of the heat-insulating layer of metal oxide is effected, for example, via the formation of a homogeneous, growing aluminum oxide reaction layer (mediator layer) between the heat-insulating layer and an adhesive layer consisting of a metal alloy of the MCrAlY type. In addition, the reactive gas-flow sputtering method, with the use of a hollow-cathode arrangement through which an inert gas flows, has the advantage that it can be carried out in a relatively low vacuum with sufficient deposition of metal oxides on the substrate. Compared with the known electron-beam PVD methods with complicated electron-beam deflecting and focusing functions, the method described is distinguished by simple control or regulation of the process variables, such as germinating temperature, level of vacuum, oxygen partial pressure, volumetric flow of the inert gas, and output of the hollow-cathode discharge. The process variables required to achieve a structure having an average stem diameter of less than 2.5 $\mu$m are determined with the aid of the Thornton diagram for the formation of the PVD layer structure, as described by J. A. Thornton, for example, in the Journal of Vacuum Science Technology, vol. 11, 1974, pages 666 to 670. Described therein is the formation of the layer structure as a function of the substrate temperature, the vacuum-chamber gas pressure and the coating energy content for activating plasma-exchange processes.

The anode does not wear out, since it is not subjected to any coating or oxidation when arranged in the gas-inlet region. Wearing parts, such as anode and cathode, can be kept small, in particular since the anode is arranged inside the hollow cathode and is therefore not subjected to a direct bombardment of electrons or ions. In addition, the anode can be produced with high degree of purity. Furthermore, it is advantageous that the materials to be atomized themselves function as cathode and do not have to be supplied as metal-oxide bodies with predetermined mixture ratio.

Other features which are considered as characteristic for the invention are set forth in the appended claims.

Although the invention is illustrated and described herein as embodied in a coating apparatus for producing a heat-insulating layer, in particular a heat-insulating-layer system, on a base and to a method of coating a base under vacuum with a heat-insulating layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
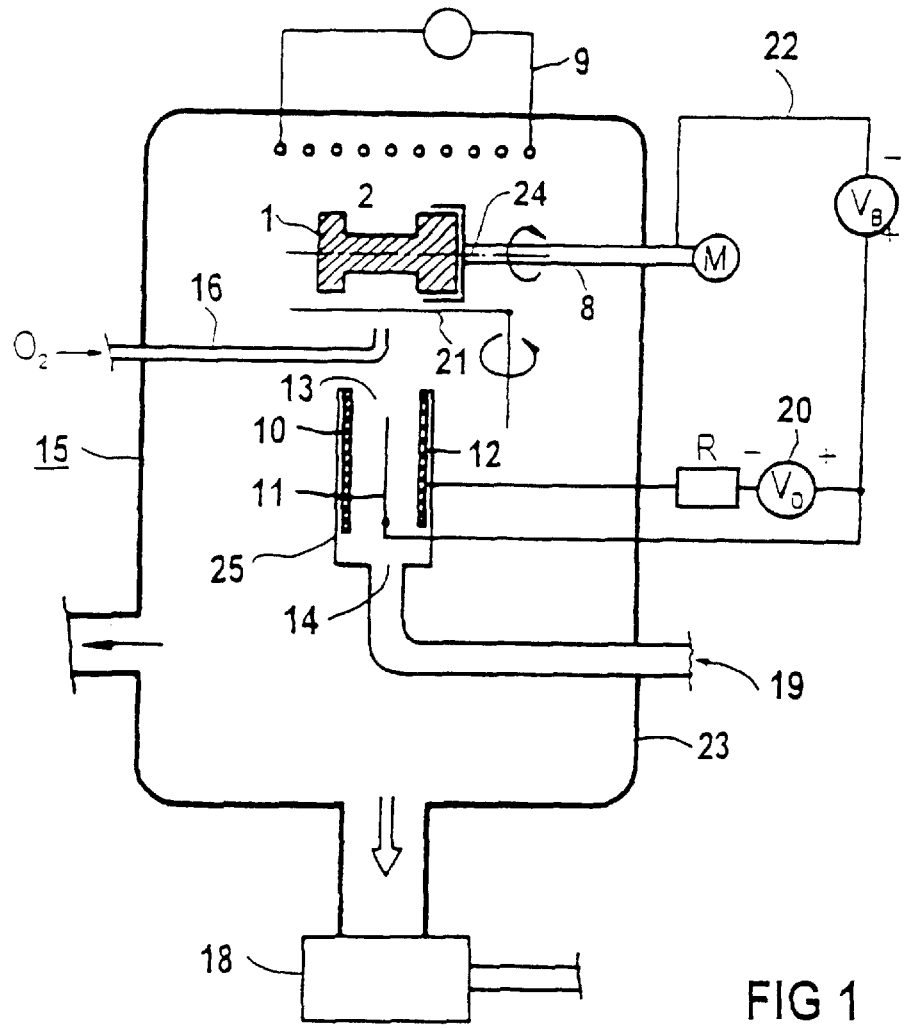
FIG. 1 is a diagram showing a component arranged in an apparatus for coating it with a heat-insulating layer.

In all the figures of the drawing, sub-features and integral parts that correspond to one another bear the same reference symbol in each case.

Referring now to the figures of the drawing in detail and first, particularly, to FIG. 1, there is shown, schematically and not to scale, a basic setup of a coating apparatus 15 for carrying out a reactive gas-flow sputtering method. The coating apparatus 15 has a housing 23 in which a vacuum of less than 1 mbar, in particular about 0.5 mbar, can be produced by a vacuum pumping device 18. A hollow cathode 10 of circular-cylindrical cross-section is arranged inside the housing 23. A plurality of such cylindrical hollow cathodes or a linear hollow cathode of rectangular cross-section, which are/is oriented along a longitudinal axis, may be used for coating large components. Arranged inside the hollow cathode 10 is a rod-shaped anode 11, which is connected to the hollow cathode 10 via a direct-current voltage supply 20. The direct-current voltage supply 20 produces, for example, a direct-current voltage of 400 V to 800 V, which leads to a discharge current of about 2 A. The hollow cathode 10 has a cathode material 12 which is shaped as a hollow cylinder or consists, for example, of individual plates which fill the inner wall of the hollow-cathode arrangement 10. The hollow cathode 10 has an outer housing having a gas-inlet opening 14 which is connected to a gas supply (not shown), via which an inert gas 19, in particular argon, is passed into the hollow cathode 10. The outer housing 25 serves to direct the inert-gas flow, to prevent the ingress of reactive gas into the hollow cathode 10, and to screen surfaces which carry cathode potential and are not to be atomized, in particular cooling plates (not shown) of the cathode material 12. Opposite the gas-inlet opening 14, the hollow cathode 10 has a gas-outlet opening 13, from which the inert gas 19 flows out of the hollow cathode 10 after passing through the region between the cathode material 12 and anode 11. An oxidizing-medium feed 16 is arranged with an orifice region geodetically above the gas-outlet opening 13, through which oxidizing-medium feed 16 oxygen can be passed into the housing 23. Geodetically above the oxidizing-medium feed 16, a component 1 i.e. a gas-turbine blade, having a substrate 2 is held in a holding device 8. The holding device 8 can be electrically connected to the hollow cathode 10 via an additional-voltage supply 22. A direct-current voltage, which can be applied between the hollow cathode 10 and the holding device, or the component 1, cleans the surface of the component 1 by ionized inert-gas atoms. The holding device 8 preferably has a drive device M (not shown in detail), by which continuous rotation of the component 1 about its longitudinal axis 24 takes place. A heating device 9 for heating the component via heat radiation and/or convection is arranged geodetically above the component 1. The heating device 9 can, of course also be arranged at the same geodetic level next to the component 1 as required. Likewise, all details of the configuration may be implemented in an opposite geodetic arrangement or in a horizontal arrangement.

Figure 2:
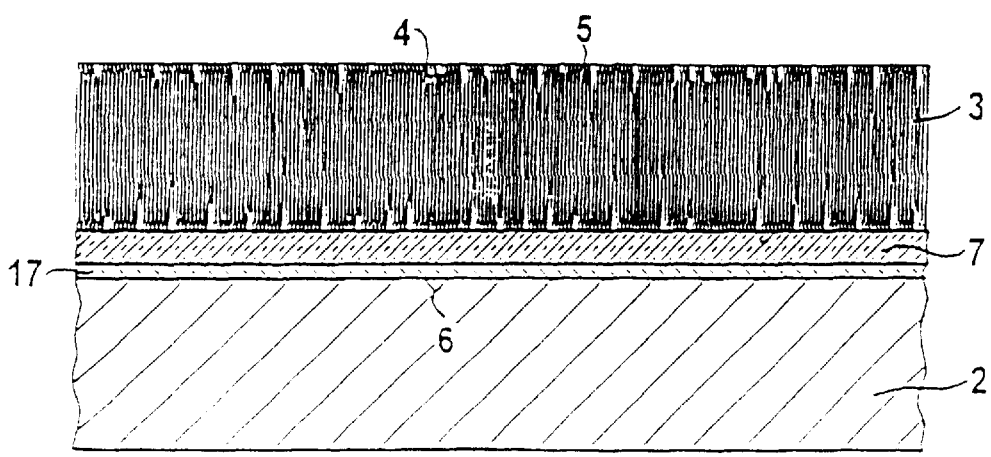
FIG. 2 is a diagram showing a magnified longitudinal section through the component.

To apply a heat-insulating layer 3, which is shown on an enlarged scale in FIG. 2, the component 1 is preferably heated to a temperature above 900° C. The inert gas 19 is passed into the hollow cathode 10 through the gas-inlet opening 14. On account of the voltage difference prevailing in the hollow cathode 10, the inert gas 19 is ionized in the form of a glow discharge, in the course of which the ionized gas atoms strike the cathode material 12. The latter is preferably a pure metal, such as zirconium, to which a stabilizing metal, for example yttrium, is added in a predetermined volumetric distribution. Metal atoms and/or metal clusters are released from the cathode material 12 by the ionized inert-gas atoms and are transported in the inert-gas flow 19 in the direction of the component 1. Complete oxidation of the metal atoms, in particular to form zirconium oxide and yttrium oxide, takes place by means of the oxygen fed via the oxidizing-medium feed 16. If a shading means 21 arranged geodetically below the component 1 is turned to the side, these oxides are deposited on the substrate 2 of the component 1 in the form of a partly stabilized metal-oxide-ceramic heat-insulating layer 3. Uniform coating of the component 1 is effected by rotation of the component 1 about its longitudinal axis 24. Thermally stable chemical bonding of the metal oxide on the substrate 2 takes place via a metallic adhesive layer 17, applied to the substrate 2 and consisting, for example, of iron, nickel and/or cobalt as well as chromium, aluminum and yttrium, and a mediator layer 7, for example aluminum oxide, grown thereon.

The deposition of the metal oxide takes place in the form of the heat-insulating layer 3 having a columnar fine structure 4 (see FIG. 2). The ceramic stems 5 formed are mainly oriented normal to the surface 6 of the substrate 2 and have a diameter of less than 5.0 $\mu$m on average, in particular between 0.5 $\mu$m and 3.0 $\mu$m, as has been possible to show by tests. Especially high resistance of the heat-insulating layer 3 to thermal alternating stresses with temperature differences of up to 1000° C. and above is achieved by this columnar fine structure 4 with a small stem diameter.

The invention is therefore distinguished by the fact that a thermally stable heat-insulating layer is deposited on a metallic parent body by a method which is simple to control and regulate. This heat-insulating layer, which is coupled to the metallic substrate in a thermomechanically stable manner via one or more intermediate layers, has a columnar fine structure with an average stem diameter of less than 5.0 $\mu$m. In particular, high thermal resistance of the heat-insulating layer to thermal cycling is thereby achieved and is thus especially suitable for use in components subjected to high thermal stress, such as components of a gas-turbine plant, in particular gas-turbine blades and combustion-chamber linings, which are exposed to hot gas.

We claim:

1. Method of coating a substrate under vacuum with a heat-insulating layer, in which method an inert gas is ionized in an essentially oxygen-free atmosphere, and the ionized inert gas releases from a metallic cathode material metal atoms, which are carried along with the inert gas in the direction of the substrate and to which oxygen is fed before the substrate is reached so that a metal oxide forms and is deposited on the substrate or metal is deposited on the substrate and is oxidized by oxygen coming into contact with it, the substrate being heated to a predetermined germinating temperature of over 800° C.

2. Method according to claim 1, in which the germinating temperature is between 950° C. and 1050° C.

3. Method according to claim 1, in which the process variables of germinating temperature, vacuum pressure, oxygen partial pressure, and volumetric flow of the inert gas, are selected such that the heat-insulating layer has ceramic stems of a diameter of less than 2.5 $\mu$m.

4. Method according to claim 3, in which the heat-insulating layer has ceramic stems of a diameter between 0.5 $\mu$m and 2.0 $\mu$m.

* * * * *